(12) United States Patent
Stek et al.

(10) Patent No.: US 9,183,080 B2
(45) Date of Patent: *Nov. 10, 2015

(54) DEVICE FOR ENCODING AND DECODING USING SMALLER BLOCK OF SYMBOLS

(71) Applicant: KONINKLIJKE PHILIPS N.V., Eindhoven (NL)

(72) Inventors: Aalbert Stek, Emmen (NL); Cornelis Marinus Schep, Weesp (NL); Martinus Wilhelmus Blum, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/220,241

(22) Filed: Mar. 20, 2014

(65) Prior Publication Data

US 2014/0208186 A1 Jul. 24, 2014

Related U.S. Application Data

(63) Continuation of application No. 12/465,747, filed on May 14, 2009, now Pat. No. 8,683,300, which is a continuation of application No. 11/681,953, filed on Mar. 5, 2007, now Pat. No. 7,549,110, which is a continuation of application No. 10/501,824, filed as application No. PCT/IB02/05413 on Dec. 12, 2002, now Pat. No. 7,200,795.

(30) Foreign Application Priority Data

Jan. 21, 2002 (EP) .................................... 02075228

(51) Int. Cl.
*H03M 13/00* (2006.01)
*G06F 11/10* (2006.01)

(Continued)

(52) U.S. Cl.
CPC ............ *G06F 11/10* (2013.01); *G11B 20/1833* (2013.01); *H03M 13/1515* (2013.01); *H03M 13/2942* (2013.01); *H03M 13/6516* (2013.01); *H03M 13/3761* (2013.01)

(58) Field of Classification Search
CPC ...................... H03M 13/3761; H03M 13/2942
USPC .................................................. 714/776, 801
See application file for complete search history.

(56) References Cited

U.S. PATENT DOCUMENTS 4,028,731 A 6/1977 Arps et al.
5,084,891 A 1/1992 Ariyavisitakul et al.
(Continued)

FOREIGN PATENT DOCUMENTS

WO 0104895 A1 1/2001

OTHER PUBLICATIONS

Sasaki, "Intel Developer Forum (Digital Home) & IHollywoodforum Digital Living Room", IDF & Digital Living Room, DIGDIA, Digital Media, Mar. 2005, p. 1-40.
(Continued)

*Primary Examiner* — M. Mujtaba K Chaudry

(57) ABSTRACT

A method of encoding user data into codevectors of an error correcting code, includes generating a first block of data symbols including user data symbols and dummy data symbols; encoding the first block using an ECC encoder to obtain a codeword comprising the first block of data symbols and a second block of parity symbols; and generating a codevector by selecting a user data portion of the user data symbols from the first block and a parity portion of the parity symbols from the second block. The sum of a number of the user data portion and a number of the parity portion is smaller than the sum of a number of the user data symbols and a number of the parity symbols of the second block.

14 Claims, 3 Drawing Sheets

Figure 1:
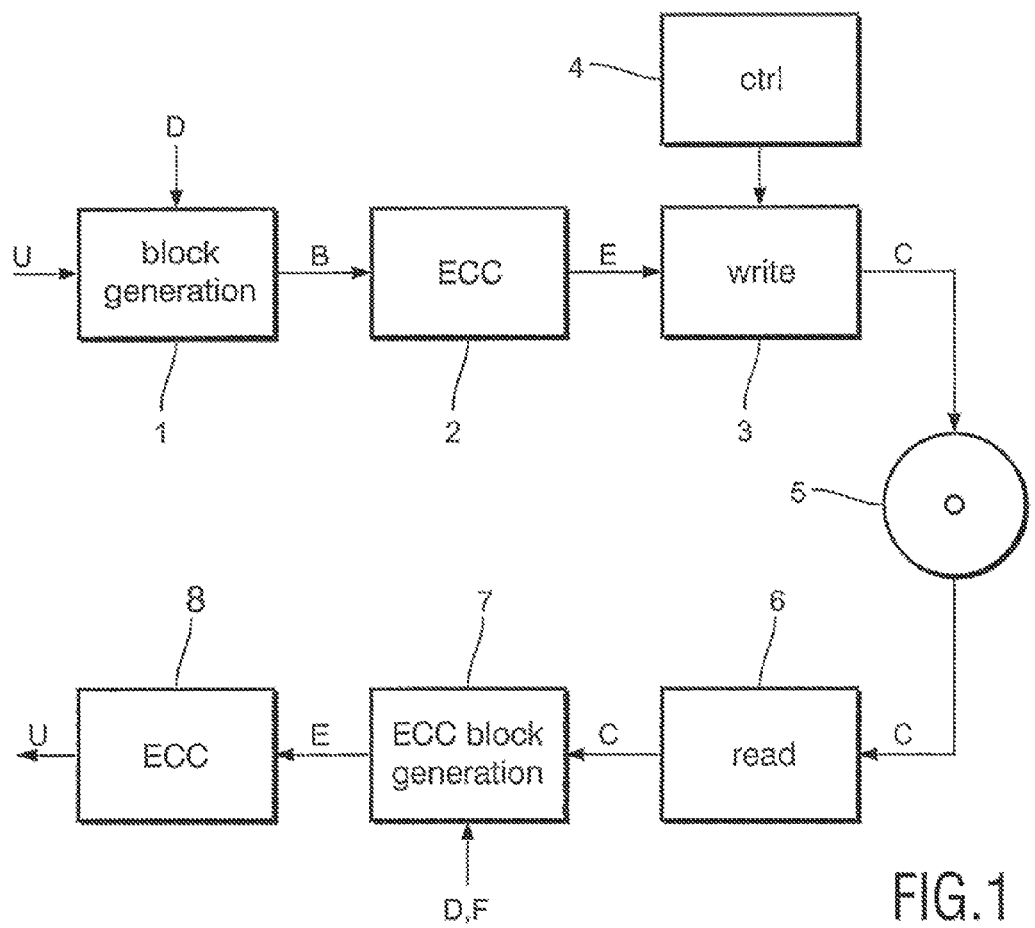

(51) Int. Cl.
    *H03M 13/29*     (2006.01)
    *G11B 20/18*     (2006.01)
    *H03M 13/15*     (2006.01)
    *H03M 13/37*     (2006.01)

(56) References Cited

U.S. PATENT DOCUMENTS

| | | | | |
|---|---|---|---|---|
| 5,220,568 | A | * | 6/1993 | Howe et al. ............ 714/782 |
| 5,257,270 | A | | 10/1993 | Hilden et al. |
| 5,289,501 | A | * | 2/1994 | Seshadri et al. ............ 375/286 |
| 5,508,701 | A | | 4/1996 | Nose et al. |
| 5,835,144 | A | | 11/1998 | Matsumura et al. |
| 5,872,798 | A | * | 2/1999 | Baggen et al. ............ 714/755 |
| 5,883,589 | A | | 3/1999 | Takishima et al. |
| 6,024,485 | A | | 2/2000 | Yoshida |
| 6,054,943 | A | | 4/2000 | Lawrence |
| 6,141,787 | A | | 10/2000 | Kunisa et al. |
| 6,188,793 | B1 | | 2/2001 | Kimura et al. |
| 6,199,190 | B1 | * | 3/2001 | Wan ............ 714/786 |
| 6,928,603 | B1 | * | 8/2005 | Castagna et al. ............ 714/786 |
| 7,050,419 | B2 | * | 5/2006 | Azenkot et al. ............ 370/347 |
| 7,103,829 | B2 | | 9/2006 | Van Dijk et al. |
| 7,178,083 | B1 | | 2/2007 | Stek et al. |
| 2002/0124225 | A1 | * | 9/2002 | Marchant ............ 714/764 |

OTHER PUBLICATIONS

Coene, "Channel Coding and Signal Processing for Optical Recording Systems Beyond DVD" IEEE Transactions on Magnetics, vol. 37, No. 2, Mar. 2001, p. 682-688.
Dijk et al, "Coding for Informed Decoders", Washington, DC 2001.
Reed-Solomon Codes, "An Introduction to Reed-Solomon Codes: Principles, Architecture and Implementation", XP002261706, p. 1-7, Nov. 17, 2003.
"Intel Developer Forum (Digital Home) & iHollywoodforum Digital Living Room" DIGDIA, Digital Media, Mar. 2005, pp. 1-40.

* cited by examiner

DEVICE FOR ENCODING AND DECODING USING SMALLER BLOCK OF SYMBOLS

This application is a continuation of prior U.S. patent application Ser. No. 12/465,747, filed May 14, 2009, now U.S. Pat. No. 8,683,300, issued Mar. 25, 2014, which is a continuation of prior U.S. patent application Ser. No. 11/681,953, filed Mar. 5, 2007, now U.S. Pat. No. 7,549,110, issued Jun. 16, 2009, which is a continuation of prior U.S. patent application Ser. No. 10/501,824, filed Jul. 19, 2004, now U.S. Pat. No. 7,200,795, issued Apr. 3, 2007, which is a National Stage Application of PCT/IB02/05413, filed Dec. 12, 2002, and which claims the benefit of European Patent Application No. 02075228, filed Jan. 21, 2002, the entire contents of each of which are incorporated herein by reference thereto.

The invention relates to a method of encoding user data into code words of an error correcting code (ECC), to a corresponding method of decoding code words of an error correcting code into user data, to corresponding devices for encoding or decoding, to an information carrier and to a computer program product.

Information carriers like rewritable optical discs, such as a CD-RW, a DVD+RW or a DVR information carrier, contain different kinds of data. For example, a rewritable optical record carrier comprises written user data like video or audio information in the phase change material and address information, for example specifying the position of the user data in each field, the track number, the frame number, the field number or the line number, in the wobble channel. To protect this information parities are added to the information in such a way that errors during read out can be corrected. A well-known method to calculate and correct data with parities are error correcting codes, particularly Reed Solomon Codes (RS codes).

In a reading device for reading information from an information carrier particularly the costs for the hardware of the decoder, i.e. the error correcting unit, are high. When due to careful design of the error correcting code used for storing data on the information carrier, however, it will be possible to use the same decoder for more than one type of data so that hardware costs for different types of decoders in one reading device can be saved. However, different types of data almost always imply different types of constraints such as block length and parity length of the decoder which issues have to be solved.

The issue of different block length is already addressed in WO 01/04895 A1. Therein a device for reading an information carrier carrying an identification information and user information is disclosed. The identification information is arranged so as to be spread over the information carrier. Organization means are provided for organizing the information in such a way that both the identification information and the user information can be processed by the error correction means.

It is an object of the present invention to provide methods of encoding and decoding as well as corresponding devices which enable the use of the same decoder for different types of data, particularly error correcting codes having different numbers of parities.

This object is achieved according to the present invention by a method of encoding user data into codevectors of an error correcting code, comprising the acts of:

generating a first block of data symbols including user data symbols and dummy data symbols;

encoding the first block using an ECC encoder to obtain a codeword comprising the first block of data symbols and a second block of parity symbols; and generating a codevector by selecting a user data portion of the user data symbols from the first block and a parity portion of the parity symbols from the second block, wherein a sum of a number of the user data portion and a number of the parity portion is smaller than a sum of a number of the user data symbols and a number of the parity symbols of the second block.

A corresponding method of decoding a codevector of an error correcting code (ECC) into user data, the codevector having been generated from a codeword comprising a first block and a second block by selecting a user data portion of user data symbols from the first block and selecting a parity portion of parity symbols from the second block, the first block including the user data symbols and dummy data symbols, and the second block including the parity symbols, the method comprising the acts of:

generating the codeword comprising the dummy data symbols, the codevector and filling symbols, wherein a sum of a number of the dummy data symbols, a number of the filling symbols and a number of symbols in the codevector is equal to said a sum of symbols in the codeword; and decoding the codeword using an ECC decoder to obtain the user data symbols embedded in the codevector The present invention is based inter alia on the idea to define a first block having a fixed block length, to fill in user data to be encoded in one portion and to fill up the remaining portion with dummy data symbols. The block length is chosen such that it is consistent with the block length expected by an ECC encoder already present and used for encoding other data. After encoding of said block, however, not the complete obtained codeword is used as codevector and, e.g. stored on an information carrier or transmitted over a network, but only a certain part thereof, particularly a predetermined number of user data symbols and parity symbols included in said codeword in order to save storage and/or to comply with given storage requirements.

Correspondingly, during decoding the same codeword is formed, filled in with the received codevector, the same dummy data symbols and, in remaining empty portions, with filling symbols. Said filling is controlled such that the order of the symbols is the same as in the codeword obtained during encoding. Thus, an ECC decoder already present and used for decoding codevectors of other codes can be used for decoding said codevectors to obtain the user data embedded in said codevectors. This simplifies devices for recording and/or reading of information carriers storing different types of data because, generally, only one type of error correcting means has to be included reducing the production costs of such devices.

It should be noted that it is not relevant for the invention which user data symbols and which parity symbols of a codeword are taken and used as a codevector. Further, the position of the dummy data symbols and the user data symbols in a codeword are arbitrary; the only requirement is that the positions of the dummy data symbols and the user data symbols are known and that the values of the dummy data symbols are known.

Preferred embodiments of the invention are defined in the dependent claims. In accordance with a preferred aspect of the invention an erasure flag is used indicating to the decoder that the codeword contains filling symbols to be corrected by said ECC decoder, in particular indicating the position and/or the number of filling symbols in said codeword to said ECC decoder. This has the advantage that the number of parities necessary to correct errors by an ECC decoder can be reduced, if the decoder already knows that there are errors and in which positions these errors are. E.g., when the decoder already knows that the codeword comprises 16 errors, i.e. comprises 16 filling symbols marked as erasures by erasure flags, only 16 parities are required to correct these errors, leaving 16 parities for correcting additional errors in the written codevector. Without such erasure flags, 32 parities would be necessary to correct 16 errors.

The method according to the invention is preferably used for encoding or decoding, respectively, user data to be recorded on an optical record carrier, particularly a CD, a CD-ROM, a DVD or a DVR disc of, preferably, a rewritable or recordable type. Particularly in the field of DVR user data are stored in a special purpose zone (SPZ) or a Burst Cutting Area (BCA). In said zone, which is located at the most inner side of the disc, a "barcode" is written. The data in this barcode is protected by an ECC. Since the bit density of the barcode is very low only 32 bytes can be stored therein. In order to protect these bytes with an ECC which has a Hamming distance of 17, i.e. which uses 16 parities, the same decoder as used for decoding codewords of a long distance codeword (LDC) or for decoding Burst Indicator Subcode (BIS) words is preferably used.

Figure 2:
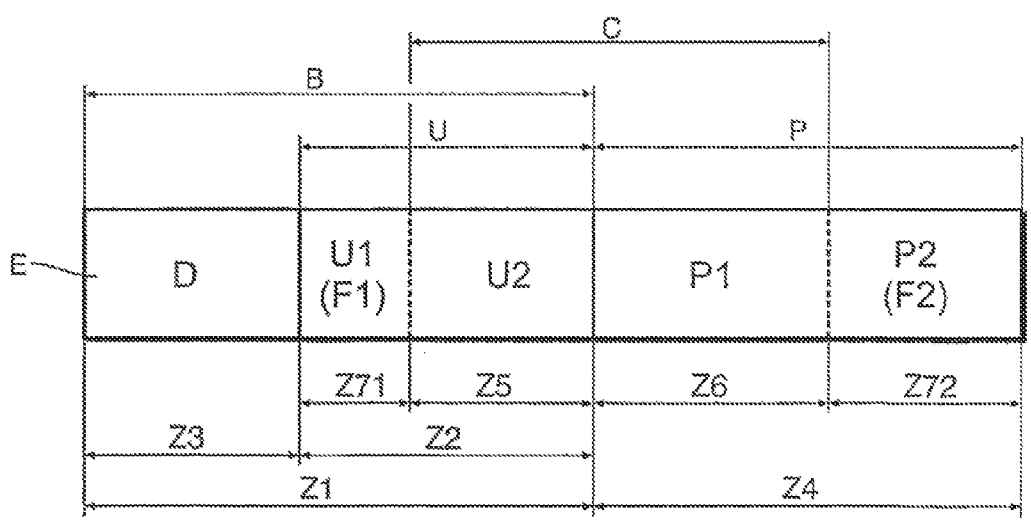
Figure 3:
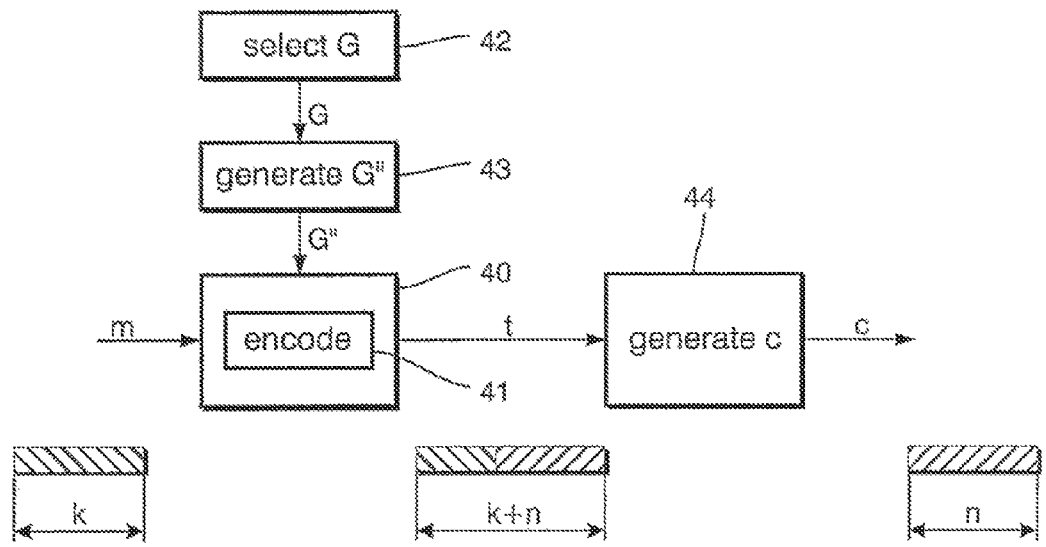
Figure 4:
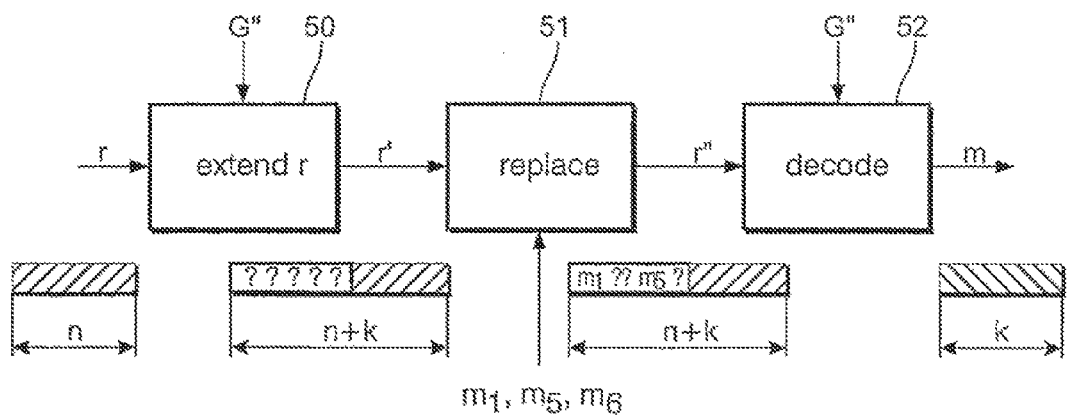

The invention will now be explained in more detail with reference to the drawings, in which FIG. 1 shows a block diagram illustrating the methods of encoding and decoding according to the present invention, FIG. 2 shows the generation of a codeword and a codevector used according to the present invention, FIG. 3 shows an embodiment of an encoding apparatus illustrating code puncturing, FIG. 4 shows an embodiment of a decoding apparatus illustrating code puncturing, FIG. 5 shows another codevector according to the invention, and FIG. 6 shows still another codevector according to the invention.

The block diagram shown in FIG. 1 illustrates the methods of encoding and decoding according to the present invention. In a block generation unit 1 a first block B of a fixed first number of data symbols is generated. Said block generation unit 1 receives as input a number of user data symbols U and a number of dummy data symbols D which are arranged in a predetermined order to form said block B. Said block B of data symbols is thereafter encoded by an ECC encoder 2 to obtain a codeword E, i.e. to obtain parity symbols for error correction. While conventionally said codewords E are completely used as codevectors, according to the present invention only a fixed portion of said codewords E is used as codevectors C which are stored on an information carrier 5 by a write unit 3 under control of a control unit 4. Said control unit 4 controls the generation of said codevectors C from said codewords E, i.e. selects according to a fixed rule which symbols of said codewords E are used as codevectors C.

These blocks and symbols can be seen in FIG. 2 showing a complete codeword E and the different portions thereof. As explained, said codeword E comprises a first block B of a first fixed number Z1 of data symbols. Said data symbols comprise a fixed second number Z2 of user data symbols U (U1, U2) and a third fixed number Z3 of dummy data symbols D. These dummy data symbols D are filled in, to achieve the fixed block length of said block B and can, in general, be freely chosen. Preferably they are chosen as non-zero values, particularly having the value FF in hexadecimal notation. The ECC encoder 2 calculates a fourth fixed number Z4 of parity symbols P (P1, P2) resulting in an encoded codeword E having in total Z1+Z4 symbols. Therefrom codevectors C are generated by selecting a fifth fixed number Z5 of data symbols U2 and a fixed sixth number Z6 of parity symbols P1. Said codevectors C are then stored on the record carrier 5.

To give a more detailed example which may be applied for storing data on a DVR information carrier, particularly to protect data to be stored in a barcode of the burst cutting area (BCA) of a DVR information carrier the first block B will be formed by 16 user data symbols U and 14 dummy data symbols D, thus coming to 30 data symbols of the first block B. The PIC and main data of a DVR information carrier include so-called BIS (Burst Indicator Subcode) data which are protected by a RS code with 32 parities and having a codeword length of 62, i.e. being protected by a (62, 30, 33) RS code. In order to be able to use an ECC decoder to be built for said code also for decoding the user data stored in the barcode of the BCA the first block B having 30 data symbols is encoded by a corresponding ECC encoder, i.e. an encoder for a [62, 30, 33] code, generating 32 parity symbols, resulting in a block length of 62 symbols of the codeword E. Since the bit density of the barcode in the BCA is very low only 32 symbols (bytes) can be stored therein. Thus, according to the present invention, from said codeword E the 16 user data symbols U and 16 parity symbols P are used as codevector C and stored on the information carrier. However, in general the method according to the invention will also work if less user data symbols and more parity symbols are combined to form a codevector C as long as the sum of said symbols is 32. In the embodiment shown in FIG. 2 a number Z5 of user data symbols U2, e.g. 12 user data symbols U2, and a number Z6 of parity symbols P1, e.g. 20 parity symbols P1, are combined into one codevector.

It should be noted that it does not matter which symbols of the U and P portions of the codeword E are taken and used as codevector C. Further, the position of the D and U portions in the codevector C are arbitrary. The positions can be swapped (first U and then D); the only requirement is that the positions for the U and D portions are known and that the values of the D symbols are known.

During decoding the codevectors C are read from the information carrier 5 by a reading unit 6 and further inputted into a codeword generation unit 7. Therein the codeword E will be regenerated so that it has the same number and arrangement of symbols as during encoding. Therefore, the codeword E is filled with said third number Z3 of dummy data symbols D having the same value as the dummy data symbols D used during encoding. Thereafter the codevector C including said fifth number Z5 of user data symbols U2 and said sixth number Z6 of parity symbols P1 are inserted at the same positions as they have been in the codeword during encoding. Finally, remaining portions are filled with filling symbols F1, F2, i.e. a seventh number (Z71+Z72) of filling symbols F1, F2 is filled in at positions where in the codeword E during encoding user data symbols U1 and parity symbols P2 had been located, but had not been stored on the information carrier 5. The filling of said codeword can preferably be achieved by sending the data thereof in the correct order to an ECC decoder 8 adapted to decode such codewords E to obtain the original user data U comprising the user data symbols U1 and U2.

To enable the codeword generation unit 7 to reconstruct the codeword E it must be known to said unit 7 how the codeword E had been constructed during encoding, i.e. the number of dummy data symbols D, user data symbols U and parity symbols P, their positions in the codeword E as well as the length of the codevector including the positions of symbols selected to form said codevector C have to be known to the codeword generation unit 7, e.g. have to be fixed by a corresponding standard. Also the value of the dummy data symbols D have to be fixed in advance.

Reverting to the above described example for storing data in the barcode on an DVR information carrier, where the codevector C comprises 12 user data symbols U2 and 20 parity symbols P1, it will be clear that 4 (Z71) filling symbols F1 and 12 (Z72) filling symbols F2 are filled into the remaining portions during decoding to form the codeword E.

Preferably, the filling symbols are flagged as erasures so that the ECC decoder only requires Z71+Z72 parities to correct these errors. In the example, only 16 parities are needed to correct said 16 errors (filling symbols), similar to a conventional 16 parity code which leaves 16 parities to correct errors in the written codevector which is similar to a conventional 16 parity RS code, while without such erasure flags twice as many parities would be needed for a correction.

As already mentioned above the number Z5 of user data symbols U2 and the number Z6 of parity symbols P1 used to form the codevector C are not fixed, but only the sum Z5+Z6 of said numbers is fixed. Thus it may also be possible to use no user data symbols U and all parity symbols P, i.e. Z4 parity symbols, as codevector C. During decoding, at first Z3 dummy data symbols D, thereafter Z2 filling symbols F and finally Z4 parity symbols would then be sent as codeword E to the ECC decoder to obtain the Z2 user data symbols U, which have originally been located at the positions of the filling symbols F. Also in this case the Z2 user data symbols (erasures) can be calculated using Z2 (being smaller than Z4) parity symbols and using the remaining Z4-Z2 parity symbols to correct errors from the information carrier.

If a conventional 16 parity RS code is used 16 data symbols and 16 parities are usually written on a disc. In this codeword of 32 symbols a maximum of 16 errors can be corrected. According to the present invention a 32 parity RS code is used which will offer the same performance of the 16 parity RS code. It is important to note that according to the invention the codevector, e.g. the symbols written on disc, belong to a 32 parity RS codeword and can not be decoded by a 16 parity RS decoder. When applying the invention in DVR, on the encoding side a 248 symbols codeword is formed which comprises 200 dummy data symbols, 16 user data symbols and 32 parity symbols, i.e. a (248, 216, 33) RS code is used, called LDC or Long Distance Code in DVR. From the 16 user symbols and 32 parity symbols 32 symbols are written to disc as codevector. Again, it is important to mention that is does not matter which 32 from these 48 symbols are written to disc. On the decoding side the same 248 symbol codeword is formed. The 200 known dummy data symbols are placed on the correct positions in the codeword. The 32 symbols written to disc are also placed in the codeword and the 16 non written (and unknown) symbols are passed to the decoder as erasures. The decoder uses 16 of the 32 parities to calculate the 16 unknown symbols which leaves 16 parities to correct errors in the 32 symbol written codevector. Thus, a performance can be achieved as if a 16 parity RS code was used.

The general use of code puncturing, as particularly described in European patent application EP 01201841.2, the description of which is herein incorporated by reference, shall now be explained with reference to FIGS. 3 and 4. FIG. 3 illustrates the method of encoding an information word m into a codeword c and FIG. 4 illustrates the method of decoding a possibly mutilated codeword r into an information word m.

As shown in FIG. 3 the information word m comprising k information symbols is encoded by an encoding unit 41 of an encoding apparatus 40 using an intermediate generator matrix G". Said intermediate generator matrix G" derives from a generator matrix G which has been selected by a selection unit 42 as particularly explained in European patent application EP 01201841.2. The intermediate generator matrix G" is larger than the generator matrix G in that it comprises at least one more column than the generator matrix G. In general, the generator matrix G has k rows and n columns while the intermediate generator matrix G" has k rows and n+k columns and comprises k columns with a single non-zero entry at mutually different positions. When using said intermediate generator matrix G" for encoding the information word m, intermediate codewords t having k+n symbols are obtained. From said intermediate codeword t the codeword c is obtained from a codeword generating unit 44 by omitting a number of symbols of said intermediate codeword t. Therein the number of symbols to omit corresponds to the difference between the number of columns of said intermediate generator matrix G" and said generator matrix G. Thus, the obtained codeword c comprises n symbols. However, it is to be noted that also G can be used directly for encoding in the encoding apparatus instead of G".

During decoding a possibly multilated codeword r comprising n symbols is received by a decoder as shown in FIG. 4. In a first step the received word r is extended into a first pseudo codeword r' by an extension unit 50. Therein said intermediate generator matrix G" which has already been used in the encoder is used to determine the length of said pseudo codeword r', i.e. the number of symbols of said pseudo codeword r' corresponds to the number of columns of said intermediate generator matrix G", i.e. to the n symbols of the received word r k erasures are added to obtain the pseudo codeword r'. If G has been used directly for encoding instead of G", the pseudo codeword r' equals the n symbols of the received word r to which k erasures are added.

Thereafter, in a replacement unit 51 a priori known information symbols, e.g. $m_1$, $m_5$, $m_6$, are replaced in said pseudo codeword r' at positions of the erasures which correspond to the positions of said a priori known information symbols. This means that the erasures 1, 5 and 6 are replaced by the a priori known information symbols $m_1$, $m_5$, $m_6$. The obtained second pseudo codeword r" is thereafter inputted to a decoder unit 52 which is preferably a known error and erasure decoder decoding said second pseudo codeword r" by use of said intermediate generator matrix G" into the information word m comprising k symbols.

According to this embodiment a larger intermediate generator matrix G" is used compared to the standard generator matrix G. However, the advantage of this embodiment is that the information symbols do not need to be known a priori in successive order but any additional information symbol known a priori irrespective of the position of the information symbol within the information word generally leads to an enhanced minimum Hamming distance compared to the code used if no information symbols are known a priori.

The embodiment based on code puncturing shall now be illustrated differently. Considered is an [8, 3, 6] extended Reed-Solomon Code C over a Galois Field GF (8) defined as follows. The vector c=($c_{-1}$, $c_0$, $c_1$ . . . , $c_6$) is in C if and only if $$c_{-1} = \sum_{i=0}^{6} c_i \text{ and } \sum_{i=0}^{6} c_i \alpha^{ij} = 0 \text{ for } 1 \le j \le 4.$$

Herein, $\alpha$ is an element of GF(8) satisfying $\alpha^3 = 1+\alpha$.

It can be seen that the following intermediate generator matrix G" generates the code C $$G'' = \begin{pmatrix} 1 & 0 & 0 & \alpha^2 & 1 & \alpha^6 & \alpha^2 & \alpha^6 \\ 0 & 1 & 0 & \alpha^3 & 1 & \alpha^3 & \alpha & \alpha \\ 0 & 0 & 1 & \alpha^4 & 1 & \alpha^5 & \alpha^5 & \alpha^4 \end{pmatrix}.$$

The rightmost 5 columns of the intermediate generator matrix G" are used as a generator matrix G, i.e. the generator matrix G is $$G = \begin{pmatrix} \alpha^2 & 1 & \alpha^6 & \alpha^2 & \alpha^6 \\ \alpha^3 & 1 & \alpha^3 & \alpha & \alpha \\ \alpha^4 & 1 & \alpha^5 & \alpha^5 & \alpha^4 \end{pmatrix}.$$

The code generated by the generator matrix G has minimum Hamming distance 3. Knowledge of any j information symbols effectively increases the minimum Hamming distance from 3 to 3+j.

Coming back to the present invention, in a first embodiment for use in DVR, as explained above with reference to FIG. 2 and as shown in FIG. 5, the codevector C may comprise Z5=16 user data symbols U (Z71=0) and Z6=16 parity symbols P1. In a second embodiment for use in DVR, as shown in FIG. 6, the codevector C may comprise Z4=32 parity symbols P but no user data symbols U.

For decoding of the codevector C of the first embodiment (FIG. 5) 16 erasures are put on the locations of the parity symbols P2 by the decoder to reconstruct the codeword E, leaving Hamming distance 17 available for correcting errors and erasures in the locations of the user data symbols U and the parity symbols P in the codeword E.

For decoding of the codevector C of the second embodiment (FIG. 6) 16 erasures are put on the locations of the user data symbols U by the decoder to reconstruct the codeword E, again leaving at least Hamming distance 17 available for correcting errors and erasures in the locations of the user data symbols U and the parity symbols P in the codeword E. However, if a number x of user data symbols are known a priori to the decoder, these need not be erased by the decoder enhancing the remaining Hamming distance. Thus, the decoder decoding the reconstructed codeword E has Hamming distance 17+x available for correcting errors and erasures in the locations of the user data symbols U and the parity symbols P in the codeword E.

User data symbols can, as an example described in European patent application EP 01201841.2, be known a priori to the decoder if much of the header information of a current sector can be inferred from the previously read sectors and the table of contents, or from the knowledge where the reading or writing head will approximately land. A possible application is thus in the field of address retrieval on optical media.

It should be noted that the encoding procedure of said second embodiment is similar to the embodiment described above with reference to FIGS. 3 and 4. Therein a kx(n+k) matrix G"=(I,G) is used, where I is the kxk identity matrix, and G a kxn generator matrix. Since the standard [62,30,33] RS code used according to the present invention is a systematic code, its 30×62 generator matrix $G_{standard}$ can be written as $G_{standard}$=(I,P'), where the 30×32 matrix P' denotes the parity part of the matrix $G_{standard}$. Encoding of the dummy data symbols D corresponds to using the upper 14 rows of $G_{standard}$, while encoding of the user data symbols U corresponds to using the lower 16 rows of $G_{standard}$. Because the dummy data symbols D are known at the decoder, it can be reconstructed free of errors at the decoder. Conceptually, the contribution of the dummy data symbols D to the parities P is also known at the decoder and can be subtracted from the parity symbols P to obtain intermediate parity symbols P''', which then only depend on the user data symbols U.

The bottom 16 rows of $G_{standard}$ form a 16×62 matrix of which the first 14 columns are all-zero.

$$G_{standard} = \begin{pmatrix} I_{14} & 0 & P'_{14 \times 32} \\ 0 & I_{16} & P'_{16 \times 32} \end{pmatrix}$$

The matrix $I_{16}$ corresponds to the systematic reproduction of the user data symbols U in the codeword E which is not transmitted. The matrix $P'_{16 \times 32}$ corresponds to the part of the parity part P' of $G_{standard}$ that effectively generates the parities corresponding to the user data symbols U. In terms of the embodiment shown in FIGS. 3 and 4, the equivalence is given by $(I,G)=(I_{16}, P'_{16 \times 32})$.

It should be noted that the advantageous effect of using a number of a priori known user data symbols by the decoder can also be applied if the codevector C is not formed exclusively by parity symbols as shown in FIG. 6, but also if the codevector C consists of a number of user data symbols, but not all user data symbols, and a number of parity symbols.

It should be noted that the present invention is not limited to the above-described embodiment or to encoding or decoding of data to be stored on a DVR information carrier. The invention is generally applicable in any kind of technical field where different kinds of data shall be encoded using more than one error correcting code having different numbers of parities, particularly in any new optical, magnetic or mobile communication standard. The invention can also be applied to any kind of information carrier, be it a read-only, recordable or rewritable information carrier for storing any kind of data in any area of such an information carrier. In addition, the codevectors need not necessarily be stored but can also be transmitted over a network or a transmission line.

The invention claimed is:

1. A method of encoding user data into a codevector of an error correcting code (ECC), comprising the acts of:
    generating a first block of data symbols including user data symbols and dummy data symbols;
    encoding the first block of data symbols using an ECC encoder to obtain a codeword comprising the first block of data symbols and a second block of parity symbols; and
    generating the codevector by selecting a user data portion of the user data symbols from the first block of data symbols and a parity portion of the parity symbols from the second block of parity symbols,
    wherein a sum of a number of the user data portion and a number of the parity portion is smaller than a sum of a number of the user data symbols and a number of the parity symbols of the second block of parity symbols.

2. A method of decoding a codevector of an error correcting code (ECC) into user data, the codevector having been generated from a codeword comprising a first block and a second block by selecting a user data portion of user data symbols from the first block and selecting a parity portion of parity symbols from the second block, the first block including the user data symbols and dummy data symbols, and the second block including the parity symbols, the method comprising the acts of:
    generating the codeword comprising the dummy data symbols, the codevector and filling symbols, wherein a sum of a number of the dummy data symbols, a number of the filling symbols and a number of symbols in the codevector is equal to said a sum of symbols in the codeword; and decoding the codeword using an ECC decoder to obtain the user data symbols embedded in the codevector.

3. The method of claim 2, further comprising the act of providing an erasure flag to the ECC decoder before decoding the codeword, the erasure flag indicating that the codeword contains the filling symbols to be corrected by the ECC decoder.

4. The method of claim 3, wherein the erasure flag indicates to the ECC decoder at least one of a position and the number of the filling symbols in the codeword.

5. The method of claim 2, wherein the generating act is controlled such that an order of the dummy data symbols, the codevectors and the filling symbols corresponds to an order of the codeword encoded by an encoder, wherein the filling symbols are arranged at positions of user data symbols and/or parity symbols of the codeword encoded by the encoder which are not included in the codevector.

6. The method of claim 2, further comprising the act of recording the user data on an optical record carrier.

7. The method of claim 2, further comprising the act of recording the user data on a DVR disc in a special purpose zone (SPZ) or a burst cutting area (BCA), wherein the decoding act is performed by an an ECC decoder used for decoding codevectors of a long distance codeword or a Burst Indicator Subcode (BIS) codeword.

8. The method of claim 2, wherein said error correcting code (ECC) is a (32, 16, 17) code and the ECC decoder is configured to decode a (248, 216, 33) RS code or a (62, 30, 33) RS code.

9. The method of claim 2, wherein the ECC decoder uses a priori known user data symbols for the act of decoding the codeword.

10. A device for encoding user data into a codevector of an error correcting code (ECC), comprising:
a generator configured to generate a first block of data symbols including user data symbols and dummy data symbols;
an encoder configured to encode the first block of data symbols to obtain a codeword comprising the first block of data symbols and a second block of parity symbols; and
a writer configured to output the codevector by selecting a user data portion of the user data symbols from the first block and a parity portion of the parity symbols from the second block,
wherein a sum of a number of the user data portion and a number of the parity portion is smaller than a sum of a number of the user data symbols and a number of the parity symbols of the second block.

11. A device for decoding a codevector of an error correcting code (ECC) into user data, the codevector having been generated from a codeword comprising a first block of data symbols and a second block of parity symbols by selecting a user data portion of user data symbols from the first block of data symbols and selecting a parity portion of parity symbols from the second block of parity symbols, the first block of data symbols including the user data symbols and dummy data symbols, and the second block of parity symbols including the parity symbols, the device comprising:
a generator configured to generate the codeword comprising the dummy data symbols, the codevector and filling symbols, wherein a sum of a number of the dummy data symbols, a number of the filling symbols and a number of data symbols and parity symbols in the codevector is equal to a sum of data, parity, dummy data and filling symbols in the codeword; and
a decoder configured to decode the codeword to obtain the user data symbols embedded in the codevector.

12. A non-transitory computer readable medium comprising computer instructions which, when executed by a processor, configure the processor to perform the acts of:
generating a first block of data symbols including user data symbols and dummy data symbols;
encoding the first block of data symbols using an ECC encoder to obtain a codeword comprising the first block of data symbols and a second block of parity symbols; and
generating a codevector by selecting a user data portion of the user data symbols from the first block of data symbols and a parity portion of the parity symbols from the second block of parity symbols,
wherein a sum of a number of the user data portion and a number of the parity portion is smaller than a sum of a number of the user data symbols and a number of the parity symbols of the second block of parity symbols.

13. A non-transitory computer readable medium comprising computer instructions which, when executed by a processor, configure the processor to perform a method of decoding a codevector of an error correcting code (ECC) into user data, the codevector having been generated from a codeword comprising a first block of data symbols and a second block of parity symbols by selecting a user data portion of user data symbols from the first block of data symbols and selecting a parity portion of parity symbols from the second block parity symbols, the first block of data symbols including the user data symbols and dummy data symbols, and the second block of parity symbols including the parity symbols, the method comprising the acts of:
generating the codeword comprising the dummy data symbols, the codevector and filling symbols, wherein a sum of a number of the dummy data symbols, a number of the filling symbols and a number of data symbols and parity symbols in the codevector is equal to a sum of data, parity, dummy data and filling symbols in the codeword; and
decoding the codeword using an ECC decoder to obtain the user data symbols embedded in the codevector.

14. A non-transitory computer readable medium comprising a codevector of an error correcting code encoded by a method comprising the acts of:
generating a first block of data symbols including user data symbols and dummy data symbols;
encoding the first block of data symbols using an ECC encoder to obtain a codeword comprising the first block of data symbols and a second block of parity symbols; and
generating the codevector by selecting a user data portion of the user data symbols from the first block of data symbols and a parity portion of the parity symbols from the second block of parity symbols,
wherein a sum of a number of the user data portion and a number of the parity portion is smaller than a sum of a number of the user data symbols and a number of the parity symbols of the second block of parity symbols.

* * * * *